United States Patent [19]

Tanaka et al.

[11] Patent Number: 5,267,292
[45] Date of Patent: Nov. 30, 1993

[54] X-RAY EXPOSURE APPARATUS

[75] Inventors: Yutaka Tanaka, Yokohama; Nobutoshi Mizusawa, Yamato; Mitsuaki Amemiya, Atsugi; Takao Kariya, Hino; Isamu Shimoda, Zama, all of Japan

[73] Assignee: Canon Kabushiki Kaisha, Tokyo, Japan

[21] Appl. No.: 26,105

[22] Filed: Mar. 1, 1993

Related U.S. Application Data

[63] Continuation of Ser. No. 733,977, Jul. 22, 1991, abandoned, which is a continuation of Ser. No. 417,054, Oct. 4, 1989, abandoned.

[30] Foreign Application Priority Data

Oct. 5, 1988 [JP] Japan ................... 63-249902

[51] Int. Cl.5 .............................................. G21K 5/00
[52] U.S. Cl. ....................................... 378/34; 378/35; 250/492.2
[58] Field of Search .................. 378/34, 35; 250/492.2

[56] References Cited

U.S. PATENT DOCUMENTS

| | | | |
|---|---|---|---|
| 4,185,202 | 1/1980 | Dean et al. | 378/34 |
| 4,516,254 | 5/1985 | Komeyama et al. | 378/34 |
| 4,748,646 | 5/1988 | Osada et al. | 378/34 |
| 4,825,453 | 4/1989 | Kembo et al. | 378/34 |

FOREIGN PATENT DOCUMENTS 0178660 4/1986 European Pat. Off. .
2155201 9/1985 United Kingdom .

Primary Examiner—David P. Porta
Assistant Examiner—Don Wong
Attorney, Agent, or Firm—Fitzpatrick, Cella, Harper & Scinto

[57] ABSTRACT

An X-ray exposure apparatus for exposing a semiconductor wafer to a mask with X-rays, to print a pattern of the mask onto the wafer, is disclosed. The ambience within a stage accommodating chamber, accommodating a mask, a semiconductor wafer, and the like, is replaced by helium. Thereafter, a predetermined quantity of helium is supplied into the stage accommodating chamber. This effectively prevents degradation of the purity of helium due to air leakage into the chamber. Therefore, any undesirable decrease in the quantity of X-ray transmission can be avoided. Thus, high-precision and high-throughput exposure is ensured.

15 Claims, 2 Drawing Sheets

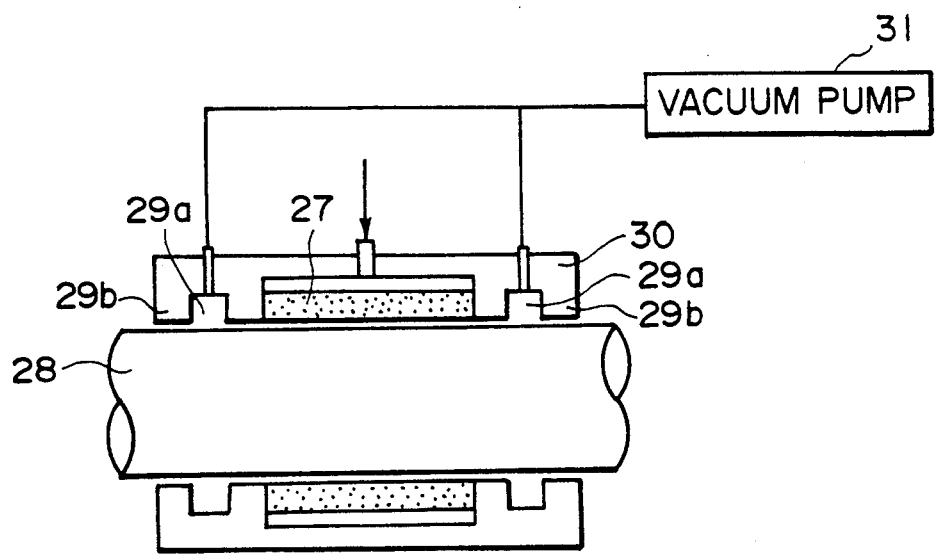
F I G. 2
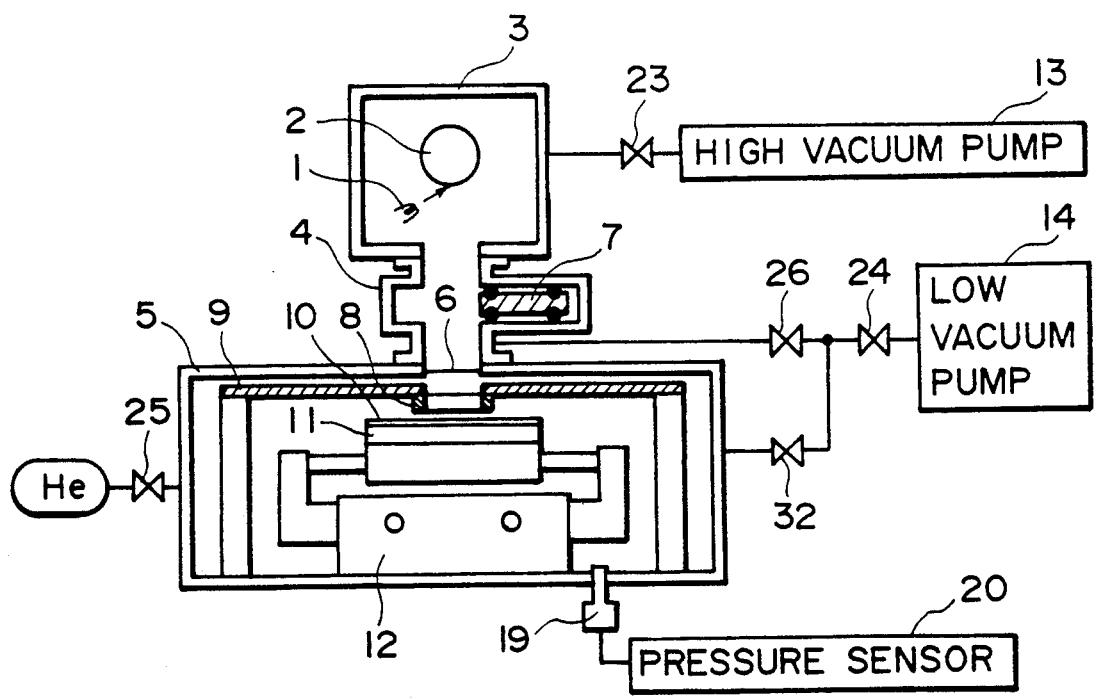
F I G. 3

X-RAY EXPOSURE APPARATUS

This application is a continuation of prior application, Ser. No. 07/733,977 filed Jul. 22, 1991, which application is a continuation of prior application, Ser. No. 07/417,054 filed Oct. 4, 1989, both now abandoned.

FIELD OF THE INVENTION AND RELATED ART

This invention relates to an X-ray exposure apparatus for lithographically transferring a fine pattern of a semiconductor integrated circuit onto a semiconductor wafer, by using soft X-rays.

As a light source of such an X-ray exposure apparatus, examples are a bulb type one which produces X-rays by electron beam excitation, one which uses X-rays produced from plasma, one that uses synchrotron orbit radiation, and the like. All of these X-ray sources produce X-rays in a vacuum. Accordingly, usually an X-ray source is disposed in a vacuum and gas-tight X-ray source accommodating chamber, and produced X-rays are projected to a mask or wafer through a blocking window made of a material (usually, beryllium (Be)) having a high X-ray transmission factor.

If, in this case, atmosphere is present in the path of the X-ray transmission from the blocking window to a wafer, X-rays are absorbed by the atmosphere, resulting in an increase in exposure time and thus, in a decrease of the throughput. Considering an X-ray exposure apparatus as an industrially productive machine, the decrease in throughput is a critical problem. In an attempt to solve this, a proposal has been made, in accordance with which an alignment mechanism for a mask and a wafer is disposed in a vacuum and gas-tight container chamber (hereinafter "stage accommodating chamber") and such stage accommodating chamber is filled with a particular gaseous fluid (usually, helium (He) gas) of reduced pressure, lower than the atmospheric pressure, having little X-ray absorbency.

FIG. 3 shows the structure of a known type X-ray exposure apparatus.

In FIG. 3, an X-ray source comprising an electron gun 1 and a target 2, is sealed in an X-ray source accommodating chamber 3. The X-ray source accommodating chamber 3 is coupled to a high vacuum pump 13 by way of a valve 23, and the inside of the chamber is maintained at a high vacuum, not greater than $10^{-6}$ [Torr]. Barrel 4 is connected to the X-ray source accommodating chamber 3, which barrel is equipped with a gate valve 7. Mask 8 and wafer 10, which are the objects to be irradiated with X-rays, are accommodated in a stage accommodating chamber 5, together with a wafer stage 12. Denoted at 9 is a mask chuck, and at 11 is a wafer chuck.

The stage accommodating chamber 5 is provided with a beryllium blocking window 6 and, to this chamber, the barrel 4 is connected. By way of valves 32 and 24, a low vacuum pump 14 is coupled to the stage accommodating chamber 5. Also, by way of a valve 25, helium can be supplied thereinto. Denoted at 26 is a by-pass valve, and at 20 is a pressure sensor.

As a guide mechanism for the wafer stage 12, which is accommodated in the stage accommodating chamber 5, a static pressure bearing means, which is usable even in a vacuum is used.

In this example of a known type X-ray exposure apparatus, first the stage accommodating chamber 5 is vacuum-evacuated to a predetermined pressure by means of the low vacuum pump 14 and, thereafter, helium is supplied to form a reduced pressure of helium ambience in the stage accommodating chamber 5, and the exposure is effected.

SUMMARY OF THE INVENTION

In this type of X-ray exposure apparatus, however, the amount of X-ray transmission from the blocking window 6 to the wafer 10 is greatly affected by a helium and impurity gas ambience within the stage accommodating chamber 5. If the purity of helium introduced into the stage accommodating chamber 5 is low, the amount of X-ray transmission decreases, which results in a reduction in precision or a decrease in throughput, of an exposure apparatus.

Further, if, as in the above example, a static pressure bearing means is present in the stage accommodating chamber 5, mere vacuum-evacuation of the stage accommodating chamber 5 and the subsequent replacement with good-purity helium does not assure the ability of maintaining the purity of helium within the stage accommodating chamber 5 for a long period of time, since there is an air leakage from the static pressure bearing means.

Additionally, it is necessary to retain the purity of helium at a high level. If it is desired to control the purity by using some a purity detecting means, use of a very high precision detection and control means is required, and to do so is difficult in practice.

In consideration of the inconveniences involved in the conventional apparatuses, it is an object of the present invention to provide an X-ray exposure apparatus which effectively prevents a decrease in throughput of the exposure apparatus and which allows high precision exposure.

To achieve this object, an X-ray exposure apparatus according to the present invention is arranged so that, even after the atmosphere within a stage accommodating chamber in which a mask, a wafer and the like are accommodated, is replaced by helium, helium gas of a predetermined quantity is continuously supplied into the chamber. This effectively prevents degradation of the purity of helium due to air leakage into the stage accommodating chamber.

The quantity $G_{He}$ [Torrl/s] of supply of helium into the stage accommodating chamber preferably satisfies the following relationship:

$$G_{He}/(G_{He}+G_{Air}) \geq (1 - 8.74/Pd)$$

wherein $G_{He}$ [Torrl/s]... the quantity of He supplied into stage accommodating chamber $G_{Air}$ [Torrl/s]... the quantity of air leaked into stage accommodating chamber P [Torr]... the pressure in stage accommodating chamber at the time of exposure d [cm]... the distance to wafer from blocking window Further, for replacement of the inside of the stage accommodating chamber with helium, it is preferable that the stage accommodating chamber is vacuum evacuated to a predetermined pressure, at least no greater than 8.74/d [Torr] and, thereafter, helium is supplied until the pressure in the stage accommodating chamber becomes equal to a pressure P [Torr] to be established at the time of exposure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a fragmentary view showing a static pressure bearing means for use in a vacuum, which is adopted in the apparatus of the FIG. 1 embodiment.

FIG. 3 is a schematic view of a known type X-ray exposure apparatus.

DESCRIPTION OF THE PREFERRED EMBODIMENTS

Figure 1:
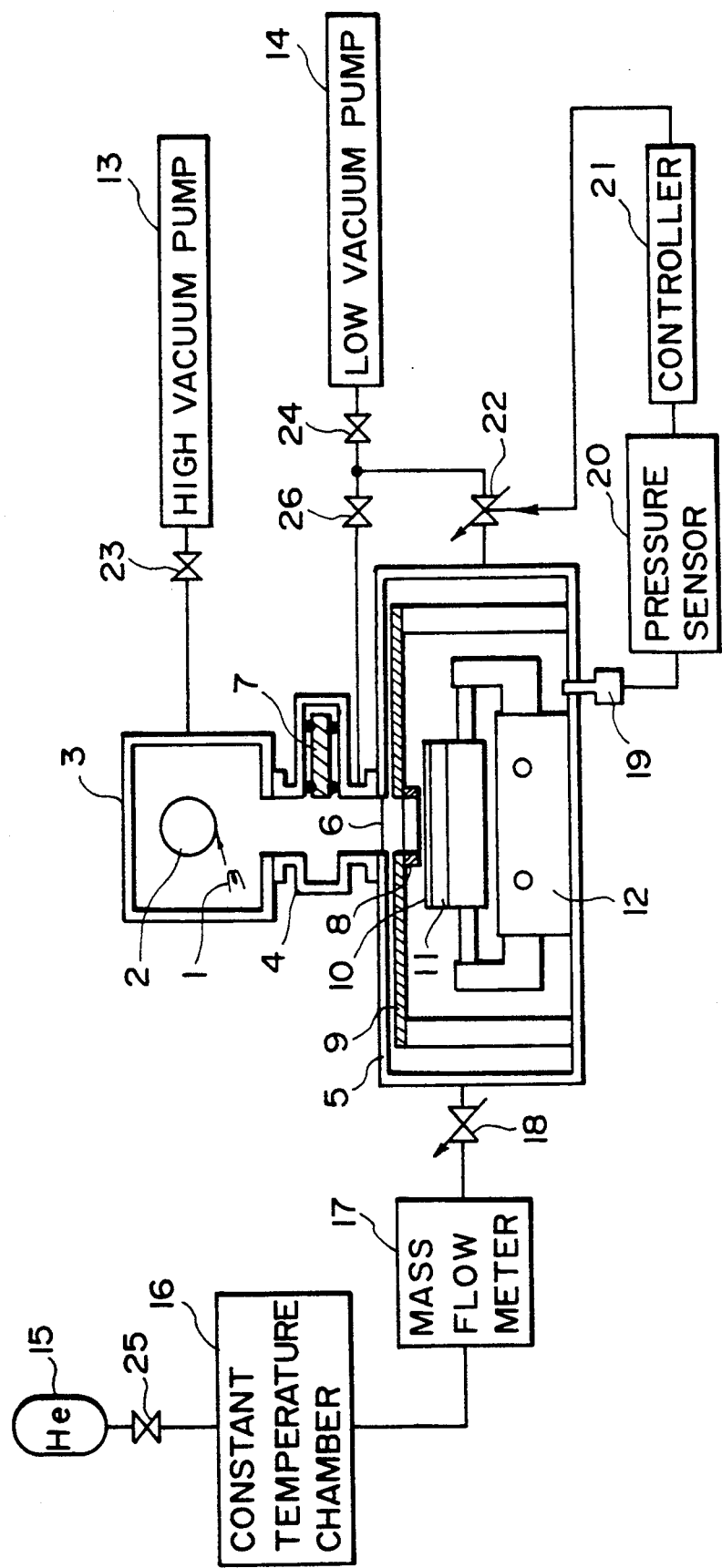
FIG. 1 is a schematic view of a bulb type X-ray exposure apparatus according to an embodiment of the present invention.

The invention will now be explained in greater detail.

If the X-ray transmission factor is denoted by Q, it can be expressed as follows:

$$Q = \exp[-\{\mu_{He}\rho_{He}(1-x) + \mu_{gas}\rho_{gas}x\} \cdot d]$$

In this equation, $\mu_{He}$ and $\mu_{gas}$ are the mass absorption coefficients of helium and impure gas, respectively; $\rho_{He}$ and $\rho_{gas}$ are the densities of the helium and the impure gas, respectively; x is the mole fraction of the impure gas; and d is the X-ray path length (the distance to the wafer from the blocking window), as described.

By using the above equation, an equation representing a change $\Delta Q$ in the X-ray transmission factor is given in the following manner:

$$\Delta Q = \partial Q/\partial \mu \cdot \partial \mu/\partial x \cdot \Delta x$$
$$\approx -\rho_0(P/760)d(M_{gas}/M_{He})\mu_{gas}\Delta x$$

In this equation, $\rho_0$ is the density of helium at a unit pressure; P is the pressure in the stage accommodating chamber at the time of exposure as described; $M_{gas}$ is the molecular weight of the impure gas; and $M_{He}$ is the molecular weight of the helium.

As for the impure gas, there may be nitrogen ($N_2$), oxygen ($O_2$), air and the like. Here, consideration will be made of the oxygen which causes the largest attenuation of X-rays.

Substituting numerical values into the above equation, it can be rewritten as follows:

$$\Delta Q = -4.58 \times 10^{-3} \times P \times d \times \Delta$$

$$\Delta x = -(\Delta Q)/(4.58 \times 10^{-3} \times P \times d)$$

Considering the purity of helium, since

Purity = 1 − (pressure of impure gas/pressure in stage accommodating chamber), it follows that:

Purity = $1 - 2 \cdot \Delta x = 1 - 437 \times \Delta Q/(P \times d)$

Assumingly, it is intended to suppress the X-ray illuminance change within a range of ±2% (as an example of a practical value) in the whole exposure apparatus. If it is assumed that all the change of ±2% in the X-ray illuminance is caused by the change $\Delta Q$ in the X-ray transmission factor, it follows that:

Purity = $1 - 8.74/P \cdot d$

Further, if, while taking into account the heat conduction and the mechanical strength of the beryllium window, the pressure P in the stage accommodating chamber is 150 [Torr] and the X-ray path d is 30 [cm], then it follows that:

Purity = 0.998

Accordingly, under the conditions described hereinbefore, the purity of helium at the time of exposure should be retained at a level not lower than 99.8%.

Additionally, although in this example all the change of ±2% in X-ray illuminance is treated as being caused only by the change in X-ray transmission factor, actually the change of ±2% should be treated as being divided into terms of several factors. In practice, it is preferable to treat one-tenth of ±2% (i.e. ±0.2%) as resulting from the change $\Delta Q$ in the X-ray transmission factor. In this case, the purity of helium at the time of exposure should be retained not lower than 99.98%.

It will be understood from the foregoing that, under the described conditions, when the inside of the stage accommodating chamber is going to be replaced by helium, preferably the stage accommodating chamber is vacuum-evacuated to a predetermined pressure at least not greater than 8.74/d [Torr] and, thereafter, helium is supplied thereinto until the pressure in the stage accommodating chamber becomes equal to the pressure P [Torr] to be established at the time of exposure.

Further, it will be understood that the quantity $G_{He}$ [Torrl/s] of supply of helium into the stage accommodating chamber preferably satisfies the following relationship:

$$G_{He}/(G_{He} + G_{Air}) \geq (1 - 8.74/Pd)$$

Pressure detecting and controlling means provided in the stage accommodating chamber may be used to maintain the pressure in the stage accommodating chamber constant. This is particularly convenient for continuously retaining the X-ray transmission factor at a level not less than a predetermined level.

Referring now to FIG. 1, there is shown the structure of a bulb type X-ray exposure apparatus according to an embodiment of the present invention. FIG. 2 shows details of an in-vacuum static pressure bearing means used in the apparatus of FIG. 1.

In FIG. 1, an electron gun 1 and a target 2, constituting an X-ray source, are accommodated in an X-ray source accommodating chamber 3. Barrel 4 is coupled to the X-ray source accommodating chamber 3 and, to this barrel 4, a stage accommodating chamber 5 is coupled. The stage accommodating chamber 5 is equipped with a beryllium blocking window 6 through which X-rays produced at the target 2 can be projected to a mask 8 and then to a wafer 10. The barrel 4 is provided with a gate valve 7.

The stage accommodating chamber 5 accommodates therein a mask chuck 9, which is adapted to hold a mask 8 at an exposure station to be irradiated with the X-rays from the target 2, and a wafer chuck 11 which is adapted to hold, at the exposure station, a wafer 10 so that it is opposed to the mask 8, as well as a wafer stage 12 which is adapted to move the wafer chuck 11 along a plane which is substantially perpendicular to the direction of X-ray irradiation. The wafer stage 12 can be used for alignment of the wafer 10 with the mask 8. For guiding the wafer stage 12, an in-vacuum static pressure bearing means is used. Details of such static pressure bearing means will be described later, with reference to FIG. 2.

To this X-ray accommodating chamber 3, a high vacuum pump 13 such as, for example, a turbo molecular pump or a diffusion pump is coupled by way of a valve 23. To the stage accommodating chamber 5 and the barrel 4, a low vacuum pump 14 such as an oil rotation pump, for example, is coupled by way of valves 22, 24 and 26. Of these valves, the valve 22 is provided in piping which joins the stage accommodating chamber 5 with the low vacuum pump 14, and it is of a variable valve type wherein the degree of opening of the valve can be changed automatically. Pressure sensor 20 is adapted to detect the pressure in the stage accommodating chamber 5, in cooperation with a detecting element 19 mounted to the stage accommodating chamber 5. On the basis of the result of this detection, controller 21 controls the degree of opening of the variable valve 22. By this, the pressure in the stage accommodating chamber 5 is controlled to be held continuously constant.

Helium gas is supplied from a helium tank 15 into the stage accommodating chamber 5, by way of a valve 25, a constant-temperature chamber 16 (whose temperature is maintained constant to make the temperature of the helium constant), a mass flow meter 17 and a valve 18, in the named order. The mass flow meter 17 is adapted to meter the quantity of supplied helium, and the valve 18 is of a type wherein the degree of opening thereof can be adjusted manually.

FIG. 2 shows details of an in-vacuum static pressure bearing means used for guiding the wafer stage 12.

In FIG. 2, housing 30 floats from an inside shaft 28, with a clearance of a few microns, by means of high pressure air discharged toward the shaft 28 through a bushing 27 which is made of a porous material. At the opposite end portions, the housing 30 is provided with pockets 29a for withdrawing air, each pocket being evacuated by means of a vacuum pump 31.

Referring to FIGS. 1 and 2, the sequence of operation of the X-ray exposure apparatus of the described structure will be explained. For convenience of explanation, it is assumed in this example that $\Delta Q = \pm 0.2\%$, $P = 150$ [Torr] and $d = 30$ [cm]. However, as a matter of course, the invention is not limited to these conditions.

First, the gate valve 7 is closed and, by means of the high vacuum pump 13, the X-ray source accommodating chamber is evacuated. On the other hand, while maintaining the by-pass valve 26 open, the stage accommodating chamber 5 is evacuated by the low vacuum pump 14 to a pressure not greater than $8.74 \times (1/10)/d = 8.74 \times (1/10)/30 = 0.029$ [Torr]. (It is to be noted here that the value "1/10" is used because one-tenth of the change of $\pm 2\%$ in the X-ray illuminance, i.e. $\pm 0.2\%$, is shared with the change in the X-ray transmission factor.) Subsequently, the gate valve 7 is opened and the bypass valve 26 is closed. The X-ray source accommodating chamber 3 is finally evacuated to a pressure not greater than $10^{-6}$ [Torr].

After this, helium of a purity 99.9999% is supplied into the stage accommodating chamber 5 until the pressure therein becomes equal to 150 [Torr], namely, until the pressure sensor 20 detects that the pressure in the stage accommodating chamber 5 becomes equal to 150 [Torr]. After this is attained, helium of a predetermined quantity (which will be described later) set in accordance with the quantity of air leakage into the chamber, is continuously supplied thereinto. On the other hand, by means of the controller 21 and the variable valve 22, any fluctuation in pressure within the stage accommodating chamber 5 is prevented, and the pressure in the chamber is maintained constantly at 150 [Torr]. The quantity of supply of helium can be adjusted manually by the variable valve 18, in accordance with the quantity metered by the mass flow meter 17.

Next, the quantity of helium supply will be explained. A major part of the quantity $G_{Air}$ of leakage of air into the stage accommodating chamber 5 is occupied by the leakage from the pockets (seals) 29a of the static pressure bearing means shown in FIG. 2, and the remaining portion can be disregarded. The clearance at the labyrinth 29b of the seal is on an order of a few microns and, therefore, there is a possibility that the leaked air is in the form of a molecular flow. Predicting a worst value, the quantity $G_{Air}$ of the air leakage into the stage accommodating chamber 5 is taken as being diffused into the stage accommodating chamber by the partial pressure of the air, not by the full pressure in the stage accommodating chamber. When the partial pressure of the air in the stage accommodating chamber 5 is denoted by $P_{SAir}$ [Torr], the partial pressure of the air in the pocket 29a is denoted by $P_{PAir}$ [Torr], and the conductance at the labyrinth 29b which is at the side of the pocket closer to the stage accommodating chamber 5 is denoted by $C$ [l/s], then:

$$G_{Air} = C(P_{PAir} - P_{SAir}) \text{ [Torrl/s]}$$
$$\approx CP_{PAir} \text{ [Torrl/s]}$$
$$(\because P_{SAir} \approx 0)$$

When there are a plurality of pockets such as at 29a in FIG. 2, the quantities of leakages from all the pockets total the quantity $G_{Air}$. For actual evaluation of a static pressure bearing means, the static pressure bearing means may be disposed within a test chamber and the pressure at the pocket may be checked. Further, the quantity $G_{Air}$ can be checked by detecting a difference in pressure attained in the stage accommodating chamber 5, between an occasion when the static pressure bearing means is introduced and an occasion when it is not introduced.

Once the quantity $G_{Air}$ of air leakage from the labyrinth portion of the static pressure bearing means is evaluated on the basis of the calculation and experiment as described hereinbefore, the quantity $G_{He}$ of supply of helium can be determined, by means of the mass flow meter 17 and the manual valve 18, so as to satisfy the following relationship:

$$G_{He}/(G_{He} + G_{Air}) \geq [1 - 8.74 \times (1/10)/(150 \times 30)]$$
$$= 0.9998$$

After this, exposure of the wafer 10 to the mask 8 with X-rays from the target 2, starts.

While, in the foregoing embodiment, description has been made under a condition that the change in helium ambience should be suppressed to not greater than $\pm 0.2\%$, as a matter of course, the value is not limited to the described example, but it may be determined on the basis of consideration of the part of the change $\pm 2\%$ in X-ray illuminance to be shared with the change $\Delta Q$ in X-ray transmission factor. Also, while in the foregoing example an in-vacuum static pressure bearing means is examined with respect to the air leakage, if a similar sealing means is used at a portion of the stage accommodating chamber 5 from which a drive is introduced into the chamber, it is necessary to consider the leakage at such portion, too. Moreover, as a matter of course, the invention is not limited to one that uses a bulb type light source.

In accordance with the present invention, as described hereinbefore, a predetermined quantity of helium is continuously supplied into the stage accommodating chamber. As a result, it is possible to avoid deterioration of the purity of helium due to air leakage thereinto and, therefore, it is possible to prevent reduction in the quantity of X-ray transmission. Further, for replacement of the inside of the stage accommodating chamber with helium, first the chamber is evacuated to a pressure at least no greater than 8.74/d [Torr] and, thereafter, helium is introduced to provide a predetermined pressure and, after this, a predetermined quantity of helium is continuously supplied into the stage accommodating chamber while, by using a pressure detecting means and a controlling means provided in the stage accommodating chamber, the pressure in the chamber is maintained at a predetermined pressure. As a result, only by a simple control of pressure, the helium ambience within the stage accommodating chamber can be stabilized and, consequently, it is possible to provide an X-ray exposure apparatus having an ability of performing high-precision exposure.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus for exposing a mask and a wafer with X-rays to transfer a pattern of the mask to the wafer, said apparatus comprising:
   a window through which the X-rays pass to expose the mask and the wafer;
   a chamber for providing a reduced pressure helium ambience in a space between said window and the wafer;
   supplying means for continuously supplying a predetermined quantity of helium into said chamber at least during a period when the mask and the wafer are exposed with the X-rays;
   vacuum means for supplying a vacuum to said chamber; and
   control means for controlling the vacuum supplied from said vacuum means to said chamber to maintain a reduced pressure helium ambience in said chamber,
   wherein, when the quantity of helium supplied into said chamber is $G_{He}$ (Torrl/s) and the quantity of air leakage into said chamber is $G_{Air}$ (Torrl/s), the quantity $G_{He}$ is so determined that $G_{He}/(G_{He}+G_{Air})$ is not lower than a predetermined purity.

2. An apparatus according to claim 1 wherein said chamber provides a reduced pressure helium ambience in a space between said window and the mask.

3. An apparatus according to claim 1 wherein said chamber provides a reduced pressure helium ambience in a space between the mask and the wafer.

4. An apparatus according to claim 3, wherein said chamber provides a reduced pressure helium ambience in a space between said window and the mask.

5. An apparatus according to claim 1, wherein said control means comprises a detector for detecting pressure in said chamber and a variable valve which is controlled in accordance with an output of said detector.

6. An apparatus according to claim 5, wherein said supplying means comprises a constant-temperature vessel and a mass flow meter.

7. An X-ray exposure apparatus for exposing a mask and a wafer with X-rays to transfer a pattern of the mask to the wafer, said apparatus comprising:
   a window through which the X-rays pass to expose the mask and the wafer;
   a chamber for providing a reduced pressure helium ambience in a space between said window and the wafer;
   supplying means for continuously supplying a predetermined quantity of helium into said chamber at least during a period when the mask and the water are exposed with the X-rays;
   vacuum means for supplying a vacuum to said chamber; and
   control means for controlling the vacuum applied from said vacuum means to said chamber to maintain a reduced pressure helium ambience in said chamber,
   wherein, when the quantity of helium supplied into said chamber is $G_{He}$ (Torrl/s), the quantity of air leakage into said chamber is $G_{Air}$ (Torrl/s), the pressure in said chamber at the time of the exposure is P (Torr) and the distance from said window to the wafer is d (cm), the quantity $G_{He}$ satisfies the following relation:

$$G_{He}/(G_{He}+G_{Air}) \geq (1-8.74/Pd).$$

8. An apparatus according to claim 7, wherein, after said chamber is vacuum-evacuated to a pressure not higher than 8.74/d (Torr), said supplying means supplies the helium so that the pressure in said chamber becomes equal to the pressure P.

9. An X-ray exposure apparatus for exposing a mask and a wafer with X-rays to transfer a pattern of the mask to the wafer, said apparatus comprising:
   a window through which the X-rays pass to expose the mask and the wafer;
   a chamber for providing a reduced pressure helium ambience in a space between said window and the wafer;
   supplying means for continuously supplying a predetermined quantity of helium into said chamber at least during a period when the mask and the wafer are exposed with the X-rays;
   vacuum means for supplying a vacuum to said chamber;
   control means for controlling the vacuum supplied from said vacuum means to said chamber to maintain a reduced pressure helium ambience in said chamber; and
   a stage mechanism accommodated in said chamber for moving the wafer, said stage mechanism having a static pressure bearing.

10. A semiconductor device manufacturing method wherein a mask and a wafer are exposed with X-rays so that a pattern of the mask is transferred to the wafer, said method comprising the steps of:

defining a window through which the X-rays pass to expose the mask and the wafer;

defining a chamber for providing a reduced pressure helium ambience in a space between the window and the wafer;

continuously supplying a predetermined quantity of helium into the chamber at least during a period when the mask and the wafer are exposed with the X-rays;

controllably supplying a vacuum to the chamber to maintain a reduced pressure helium ambience in the chamber; and exposing the mask and the wafer with the x-rays passed through the window, while maintaining the reduced helium ambience in the chamber, wherein, when the quantity of helium supplied into the chamber is $G_{He}$ (Torrl/s) and the quantity of air leakage into the chamber is $G_{Air}$ (Torrl/s), the quantity $G_{He}$ is so determined that $G_{He}/(G_{He}+G_{Air})$ is now lower than a predetermined purity.

11. A method according to claim 10, wherein, after the chamber is vacuum-evacuated, helium is supplied into the chamber so that the pressure in the chamber becomes equal to the pressure at the time of the exposure.

12. A semiconductor device manufacturing method wherein a mask and a wafer are exposed with X-rays so that a pattern of the mask is transferred to the wafer, said method comprising the steps of:

defining a window through which the X-rays pass to expose the mask and the wafer;

defining a chamber for providing a reduced pressure helium ambience in a space between the window and the wafer;

continuously supplying a predetermined quantity of helium into the chamber at least during a period when the mask and the wafer are exposed with the X-rays;

controllably supplying a vacuum to the chamber to maintain a reduced pressure helium ambience in the chamber; and exposing the mask and the wafer with the X-rays passed through the window, while maintaining the reduced pressure helium ambience in the chamber, wherein, when the quantity of helium supplied into the chamber is $G_{He}$ (Torrl/s), the quantity of air leakage into the chamber is $G_{Air}$ (Torrl/s), the pressure in the chamber at the time of the exposure is P (Torr) and the distance from the window to the wafer is d (cm), the quantity $G_{He}$ satisfies the following relation:

$$G_{He}/(G_{He}+G_{Air}) \geq (1-8.74/Pd).$$

13. The method according to claim 12, wherein, after the chamber is vacuum-evacuated to a pressure not higher than 8.74/d (Torr), the helium is supplied so that the pressure in said chamber becomes equal to the pressure P.

14. An X-ray exposure apparatus for exposing a wafer with X-rays to print a pattern thereon, said apparatus comprising:

a window through which the X-rays pass to expose the wafer;

a chamber for providing a reduced pressure gaseous ambience, containing a gas of low X-ray absorbency, in a space between said window and the wafer;

supplying means for supplying the gas into said chamber at least during a period when the wafer is exposed wit the X-rays;

vacuum means for supplying a vacuum to said chamber; and control means for controlling the vacuum supplied from said vacuum means to said chamber to maintain a reduced pressure gaseous ambience in said chamber, wherein, when the quantity of the gas supplied into said chamber is $G_{Gas}$ (Torrl/s) and the quantity of air leakage into said chamber is $G_{Air}$ (Torrl/s), the quantity $G_{Gas}$ is so determined that $G_{Gas}/(G_{Gas}+G_{Air})$ is not lower than a predetermined value.

15. An exposure apparatus for exposing a wafer with exposure energy to print a pattern thereon, said apparatus comprising:

a window through which the exposure energy passes to expose the wafer;

a chamber for providing a reduced pressure gaseous ambience, which contains a gas of low absorbency with respect to the exposure energy, in a space between said window and the wafer;

supplying means for supplying the gas into said chamber at least during a period when the wafer is exposed with the exposure energy;

vacuum means for supplying a vacuum to said chamber; and control means for controlling the vacuum supplied from said vacuum means to said chamber to maintain a reduced pressure gaseous ambience in said chamber, wherein, when the quantity of the gas supplied into said chamber is $G_{Gas}$ (Torrl/s) and the quantity of air leakage into said chamber is $G_{Air}$ (Torrl/s), the quantity $G_{Gas}$ is so determined that $G_{Gas}/(G_{Gas}+G_{Air})$ is not lower than a predetermined value.

* * * * *

UNITED STATES PATENT AND TRADEMARK OFFICE
CERTIFICATE OF CORRECTION

PATENT NO. : 5,267,292
DATED : November 30, 1993
INVENTOR(S) : YUTAKA TANAKA, ET AL.

It is certified that error appears in the above-indentified patent and that said Letters Patent is hereby corrected as shown below:

COLUMN 2:

Line 28, "some" should be deleted.

COLUMN 3:

Line 50, "$\Delta Q = -4.58 \times 10^{-3} \times P \times d \times \Delta$" should read --$\Delta Q = -4.58 \times 10^{-3} \times P \times d \times \Delta x$--.

COLUMN 5:

Line 57, "bypass" should read --by-pass--.

COLUMN 7:

Line 63, "claim 1" should read --claim 1,--; and
Line 66, "claim 1" should read --claim 1,--.

UNITED STATES PATENT AND TRADEMARK OFFICE
CERTIFICATE OF CORRECTION

PATENT NO. : 5,267,292                           Page 2 of 2
DATED      : November 30, 1993
INVENTOR(S) : YUTAKA TANAKA, ET AL.

It is certified that error appears in the above-indentified patent and that said Letters Patent is hereby corrected as shown below:

COLUMN 8:

Line 21, "water" should read --wafer--; and
Line 25, "applied" should read --supplied--.

COLUMN 9:

Line 13, "x-rays" should read --X-rays--;
Line 15, "reduced" should read --reduced pressure--; and
Line 20, "now" should read --not--.

COLUMN 10:

Line 1, "The" should read --A--; and
Line 18, "wit" should read --with--.

Signed and Sealed this

Thirty-first Day of May, 1994

Attest:

BRUCE LEHMAN

Attesting Officer    Commissioner of Patents and Trademarks